United States Patent [19]

Harada et al.

[11] Patent Number: 4,923,526
[45] Date of Patent: May 8, 1990

[54] HOMOGENEOUS FINE GRAINED METAL FILM ON SUBSTRATE AND MANUFACTURING METHOD THEREOF

[75] Inventors: Hiroshi Harada; Yoshihiro Hirata; Masanobu Tosa, all of Itami, Japan

[73] Assignee: Mitsubishi Denki Kabushiki Kaisha, Tokyo, Japan

[21] Appl. No.: 300,877

[22] Filed: Jan. 23, 1989

Related U.S. Application Data

[60] Continuation of Ser. No. 90,366, Aug. 28, 1987, abandoned, which is a division of Ser. No. 811,885, Dec. 20, 1985, Pat. No. 4,726,983.

[30] Foreign Application Priority Data

Feb. 20, 1985 [JP] Japan .................................. 60-33725

[51] Int. Cl.$^5$ .............................................. C23C 8/06
[52] U.S. Cl. ....................... 148/6.3; 427/38; 437/194; 437/957
[58] Field of Search .................. 148/63; 428/629; 437/194, 957; 427/38

[56] References Cited

U.S. PATENT DOCUMENTS

| 4,343,890 | 8/1982 | Phillips et al. | 148/6.3 |
|---|---|---|---|
| 4,615,747 | 10/1986 | Kato et al. | 148/6.3 |
| 4,649,083 | 3/1987 | Fister et al. | 428/629 |

FOREIGN PATENT DOCUMENTS 2064864  6/1981  United Kingdom ................ 437/957

OTHER PUBLICATIONS

Vossen et al (Ed.), *Thin Film Processes* (Academic Press, N.Y.), c. 1978, pp. 48–54.
*Handbook of Thin Film Technology*, herausgegeben von L. I. Maissel und R. Glang, MacGraw Hill Verlag, New York, 1970, S. 4–26 bis 4–31.

*Primary Examiner*—Stanley Silverman
*Attorney, Agent, or Firm*—Lowe, Price, LeBlanc, Becker & Shur

[57] ABSTRACT

A homogeneous fine grained metal film (6') on a substrate in accordance with the present invention comprises multiple metal layers and intervening layers (14) between the respective metal layers, the intervening layers being formed of a compound of the metal and a reactive gas and serving to suppress growth of grains (12') in the respective metal layers and to suppress electromigration of grain boundaries (13').

In a method for manufacturing a metal film (6') having homogeneous and fine grains on a substrate in accordance with the present invention, one or more intervening layers (14) are formed by introducing a gas reactive with the metal film one or more times during deposition of the metal film, whereby intervening layers of a metal compound are interposed between the successively deposited metal layers. Thus, a metal film of multilayered structure including multiple metal layers separated by the intervening layers is formed.

14 Claims, 2 Drawing Sheets

VACUUM PUMP

HOMOGENEOUS FINE GRAINED METAL FILM ON SUBSTRATE AND MANUFACTURING METHOD THEREOF

This application is a continuation of Ser. No. 090,366, filed Aug. 28, 1987, now abandoned, which is a division of application Ser. No. 811,885, now U.S. Pat. No. 4,726,983.

BACKGROUND OF THE INVENTION

1. Field of the Invention

The present invention relates to a metal film on a semiconductor integrated circuit (IC) and particularly to a metal film having homogeneous fine grains.

2. Description of the Prior Art

Conventionally, an Al thin film on an IC chip is formed by sputtering. Referring to FIG. 1, a typical sputtering apparatus is shown. In a vacuum vessel 1, an anode plate 3 and a cathode plate 2 are provided opposite to each other with a spacing. The cathode plate 2 serves also as a target for sputtering and it is of the same material as an Al thin film to be formed. A Si wafer 4 is disposed on the anode plate 3 so that an Al thin film 6 is formed on the wafer 1. A DC power supply 5 is connected between the anode plate 3 and the cathode plate 2 so as to supply DC voltage of approximately 300 V to 700 V between these electrode plates. The wafer 4 is heated to approximately 150° C. to 400° C. by a heater 7. The heater 7 is fed by an AC power supply 8. The vacuum vessel 1 comprises a valve 9 for intake of inert Ar gas necessary for sputtering.

In operation, first, the Si wafer 4 is first positioned on the anode plate 3 in the vacuum vessel 1. Then, the vacuum vessel 1 is evacuated to approximately $10^{-7}$ Torr by a vacuum pump and after that, Ar gas is fed into the vessel 1 through the valve 9. The pressure of the Ar gas in the vessel 1 is controlled to be maintained at approximately $10^{-2}$ to $10^{-3}$ Torr. In order to generate $Ar^+$ ions by glow discharge, an appropriate voltage is applied between the anode 3 and the cathode 2. During the glow discharge, $Ar^+$ ions are attracted toward the cathode plate (that is, the Al target) 2 and collide therewith so that Al atoms are sputtered out. These sputtered Al atoms are deposited on the wafer 4 to form an Al polycrystalline film 6.

In the prior art, efforts have been made to decrease grain boundary area by making large the grain size of the Al film 6 because grain boundaries are adversely affected by electromigration. Therefore, not only for densifying the Al film but also for growing grains, the wafer 4 is suitably heated by the heater 7 so as to activate the diffusion of Al atoms.

Referring to FIG. 2, the Al film 6 having a large grain size is illustrated. The Al film 6 is formed on an oxide film 10 on a major surface of the Si wafer 4. Generally, the Al film 6 has an extremely small thickness of approximately 0.5 to 2.0 μm for example and consequently, most of the grains 12 bounded by grain boundaries 13 extend from the bottom surface to the top surface of the film 6.

Recently, it has been made clear that electromigration can be effectively suppressed by adding to Al, a small amount of impurity such as Cu, Ti or Mg. Consequently, it is not necessarily needed to make large the grain size of the Al film 6. On the other side, it is known that the creep strength in view of a long time period is higher with a smaller grain size. Furthermore, an Al film having a small grain size can be patterned with high precision by etching and thus, a film with small-sized grains is suited for fine IC patterning.

SUMMARY OF THE INVENTION

An object of the present invention is to provide a metal film having homogeneous fine grains on a substrate.

Another object of the present invention is to provide a method for manufacturing a metal film having homogeneous fine grains on a substrate.

A metal film on a substrate in accordance with the present invention comprises multiple metal layers and intervening layers between the respective metal layers, the intervening layers being formed of a compound of the metal and a reactive gas and serving to suppress growth of grains of the metal layers.

In a method for manufacturing a metal film having homogeneous fine grains on a substrate in accordance with the present invention, one or more intervening layers are formed by introducing a gas reactive with the metal film one or more times during deposition of the metal film. Thus, the one or more intervening layers formed in the metal film suppress growth of grains.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
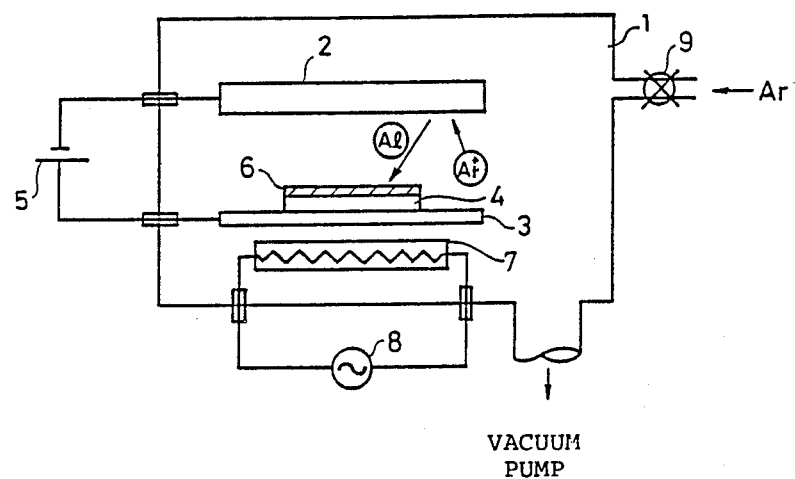
FIG. 1 is an illustration of a sputtering apparatus to be used for forming a conventional Al film on a Si wafer.
Figure 2:
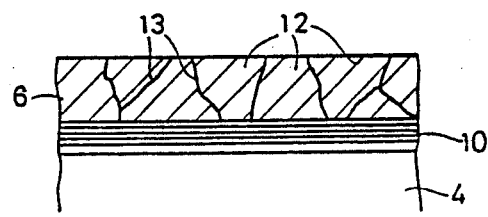
FIG. 2 is a partial sectional view showing a structure of a conventional Al film formed on a Si wafer.
Figure 3:
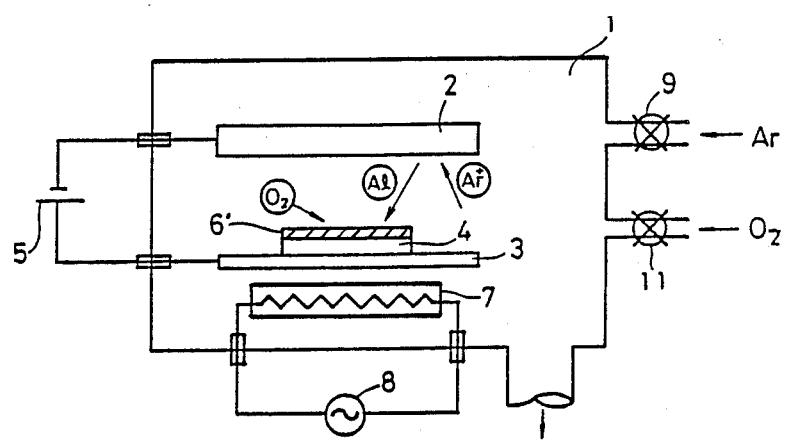
FIG. 3 is an illustration of a sputtering apparatus to be used for forming a metal film on a wafer in accordance with the present invention.

The present invention will be described with regard to an embodiment in which an Al film is formed on a Si wafer by sputtering. FIG. 3 shows a sputtering apparatus to be used in the present invention, which corresponds to the sputtering apparatus shown in FIG. 1, except that a valve 11 for intake of $O_2$ gas is provided in the vessel 11 of the sputtering apparatus. It is noted that the same reference numerals are used in FIG. 3 as in FIG. 1 for the corresponding elements.

In the operation, a Si wafer 4 is first placed on the anode plate 3 and then, Al atoms are deposited on the wafer 4 by sputtering in an atmosphere of Ar gas. After an Al layer is grown to a prescribed extent by the deposition, a small amount of $O_2$ gas, for example 0.1 to 1 SCCM is fed into the vessel 1 through the valve 11 for a period of several seconds or several tens of seconds As a result, an extremely thin layer of aluminum oxide will be formed on the top surface of the Al layer. After that, Al Atoms are deposited again in the atmosphere of Ar gas so that another Al layer is formed After the second Al layer is formed, O₂ gas is fed again.

Figure 4:
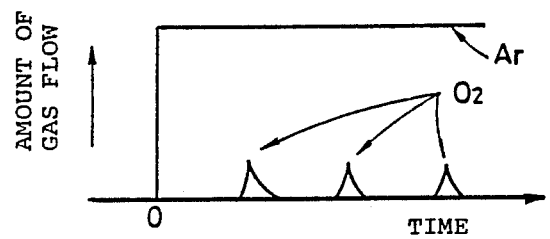
FIG. 4 is a diagram showing an example of a sequence of supply of a reactive gas in a method for manufacturing a metal film in accordance with the present invention

FIG. 4 illustrates a sequence of supply of O₂ gas by repeating the above stated steps. More specifically, O₂ gas is fed intermittently at predetermined intervals by a predetermined number of times during the growth of the Al film 6'. Accordingly, the grown-up Al film 6' contains a predetermined number of extremely thin intervening oxide layers, corresponding to the number of times O₂ gas has been fed.

Figure 5:
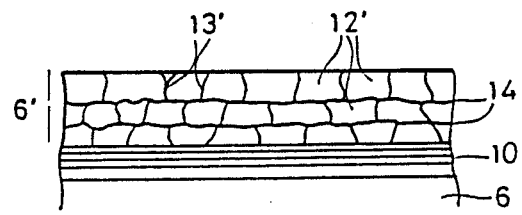
FIG. 5 is a partial sectional view showing a multilayered structure of a metal film formed on a substrate in accordance with the present invention.

FIG. 5 schematically illustrates a sectional structure of the Al film formed on the oxide film 10 on the major surface of the Si wafer 4 by a manufacturing method in accordance with the present invention. The Al film 6' comprises a plurality of Al layers and between the respective Al layers, extremely thin aluminum oxide layers 14 are interposed. Generally, the number of oxide layers 14 formed in the Al film is 10 or less.

In the Al film 6' having such a multilayered structure as shown in FIG. 5, grains 12' cannot grow beyond the oxide layers 14. Thus, the growth of the grains is suppressed within the respective thin Al layers In addition, the grain boundaries 13' bounded between the oxide layers 14 are given dragging resistance from the oxide layers with respect to electromigration. Accordingly, the Al film 6' of the multilayered structure thus formed contains homogeneous fine grains and has high resistance to electromigration.

The grain size of the Al film 6' can be controlled by adjusting the concentration or feeding intervals of O₂ gas to be supplied into the vessel 1.

Although in the foregoing embodiment, the Al film formed by sputtering was described, the present invention is also applicable to films of Al alloys such as AlSi or AlSiCu as well as other metals such as Cr or Au. Such films may be formed not only by a sputtering process but also by a vacuum evaporation process, a CVD process or a cluster ion beam process.

As the reactive gas fed for forming intervening layers for suppressing growth of grains in the metal layers, not only O₂ but also other gas such as N₂, CO₂ or NO₂ or mixed gases thereof may be used. In addition, the reactive gas need not necessarily be fed periodically. The growth of grains can be suppressed even if the reactive gas is irregularly fed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing of a metal film arrangement having substantially homogeneous fine grains on a substrate, comprising the steps of:
    (a) positioning said substrate in a deposition apparatus,
    (b) depositing a metal layer of said metal on said substrate to establish a metal layer thickness corresponding to the grain size of said metal,
    (c) feeding a gas reactive with said metal into said deposition apparatus to form a layer of a metal compound, resulting from a reaction between said metal and said gas, on an upper surface of said metal layer, and
    (d) performing step (b) after repeating said steps (b) and (c) by a predetermined number of times.

2. A method in accordance with claim 1, wherein said metal is one of aluminum or an aluminum alloy.

3. A method in accordance with claim 2, wherein said reactive gas includes oxygen.

4. A metal in accordance with claim 2, wherein said reactive gas includes nitrogen.

5. A method in accordance with claim 3, wherein said metal is deposited by sputtering.

6. A method in accordance with claim 3, wherein said metal is deposited by vacuum evaporation.

7. A method in accordance with claim 3, wherein said metal is deposited by a CVD process.

8. A method in accordance with claim 3, wherein said metal is deposited by cluster ion beam.

9. The method of claim 1, wherein said substrate is heated to a temperature in the range of approximately 150°–400° C. by a heater.

10. The method of claim 5, wherein a voltage in the range of about 300–700 volts is applied between electrodes during the sputtering process.

11. The method of claim 1, wherein the reactive gas is fed intermittently.

12. The method of claim 1, wherein the reactive gas is fed into the apparatus during deposition of metal in step (b).

13. A method of manufacturing of a metal film arrangement having substantially homogeneous fine grains on a substrate, comprising the steps of:
    (a) positioning said substrate in a deposition apparatus,
    (b) depositing a metal layer of said metal on said substrate to establish a metal layer thickness corresponding to the grain size of said metal,
    (c) feeding a gas reactive with said metal into said deposition apparatus to form a layer of a metal compound, resulting from a reaction between said metal and said gas, on an upper surface of said metal layer, and
    (d) performing steps (b) and (c) at least once after initially performing step (b) and step (c).

14. The method of claim 12, wherein the reactive gas is fed intermittently.

* * * * *